United States Patent [19]
Hillmann et al.

[11] 4,195,199
[45] Mar. 25, 1980

[54] SUPERCONDUCTING COMPOSITE CONDUCTOR AND METHOD OF MANUFACTURING SAME

[75] Inventors: Hans Hillmann; Engelbert Springer, both of Rodenbach, Fed. Rep. of Germany

[73] Assignee: Vacuumschmelze GmbH, Hanau, Fed. Rep. of Germany

[21] Appl. No.: 929,943

[22] Filed: Aug. 1, 1978

[30] Foreign Application Priority Data

Aug. 11, 1977 [DE] Fed. Rep. of Germany ....... 2736157

[51] Int. Cl.$^2$ ............................................. H01B 12/00
[52] U.S. Cl. .................................. 174/128 S; 29/599; 335/216
[58] Field of Search ............... 174/126 S, 128 S, 15 S; 29/599; 335/216

[56] References Cited

U.S. PATENT DOCUMENTS

| | | | |
|---|---|---|---|
| 3,509,622 | 5/1970 | Bernert et al. | 174/126 S |
| 3,550,050 | 12/1970 | Albrecht | 174/128 S |
| 3,600,498 | 8/1971 | Aupoix et al. | 174/126 S X |
| 3,767,842 | 10/1973 | Bronca et al. | 174/126 S |
| 3,876,473 | 4/1975 | McDougall | 174/126 S X |
| 4,079,187 | 3/1978 | Fillunger et al. | 174/126 S X |
| 4,094,060 | 6/1978 | Madsen et al. | 174/126 S |

FOREIGN PATENT DOCUMENTS 2102162 9/1971 Fed. Rep. of Germany ....... 174/128 S
2626384 12/1977 Fed. Rep. of Germany ....... 174/128 S

*Primary Examiner*—Arthur T. Grimley
*Attorney, Agent, or Firm*—Kenyon & Kenyon

[57] ABSTRACT

In a superconducting composite conductor consisting of several strands with a superconductive intermetallic compound of at least two elements, and at least one strand of a thermally and electrically highly conductive stabilizing metal which is normally conducting at the operating temperature of the superconducting composite conductor, wherein the strands with the superconductive compound each contain a core of at least one higher melting point element of the compound, having, at least on its surface, a layer of the compound, embedded in an alloy of at least one lower melting point element of the compound and a carrier metal in the form of a cable, stranded wire or flat cable, the strand of the stabilizing metal is joined to the adjacent strands containing the superconductive compound by diffusion of at least one lower melting point element of the compound and contains at least one zone, which zone extends along the strand and is enclosed by a diffusion inhibiting layer.

13 Claims, 3 Drawing Figures

SUPERCONDUCTING COMPOSITE CONDUCTOR AND METHOD OF MANUFACTURING SAME

BACKGROUND OF THE INVENTION

This invention relates to superconductors in general and more particularly to a superconductor with improved stabilization.

Superconducting composite conductors consisting of several strands with a superconductive intermetallic compound of at least two elements, and at least one strand of a thermally and electrically highly conductive stabilizing metal which is normally conducting at the operating temperature of the superconducting composite conductor, wherein the strands with the superconductive compound each contain a core of at least one higher melting point element of the compound, having, at least on its surface, a layer of the compound, embedded in an alloy of at least one lower melting point element of the compound and a carrier metal, in the form of a cable, stranded wire or flat cable, are known from German Auslegeschrift No. 23 45 779, especially column 6, line 16, to column 8, line 51, and German Offenlegungsschrift No. 26 54 924, especially page 30, para. 1, and page 64, last para., to page 67, para. 2.

Starting out from an intermediate product which consists of an alloy of a carrier metal and at least one lower melting point element of the superconductive compound and one or more cores embedded in the alloy of at least one higher melting point element of the compound, the superconductive intermetallic compound is formed in such conductors by a heat treatment, in which the lower melting point element of the compound diffuses into the core of the higher melting point element and reacts with the core material, forming the compound. Depending on the composition of the alloy, the dimensions of the intermediate product and the duration of the heat treatment, a surface layer of the core or also the entire core, can be converted into the superconductive compound.

In practice, the superconductive intermetallic compounds $Nb_3Sn$ and $V_3Ga$, in particular, are used at present, both of which have A-15 crystal structure. Both compounds have very good superconducting properties and are distinguished particularly by a high transition temperature, a high critical magnetic field and high critical current density. In order to manufacture superconductors with these compounds, one starts out, as a rule, with an intermediate product consisting of a matrix of a copper-tin alloy or of a copper-gallium alloy in which a multiplicity of niobium or vanadium cores is embedded. This intermediate product is first processed to reduce the cross section, drawing the cores into thin filaments. Subsequently, the heat treatment for forming the compound takes place. In addition to the two compounds mentioned, however, other compounds of two or more components with the same crystal structure, such as $Nb_3Ga$, $Nb_3Al$, $V_3Ga$, $V_3Si$ or $Nb_3(Al_{0.8}Ge_{0.2})$ as well as intermetallic superconductive compounds with other cyrstal structures are also of interest.

Certain difficulties arise in superconductors with superconductive intermetallic compounds due to the fact that the superconductive compounds are relatively brittle. The flexibility of the finished conductors is therefore lower, as a rule, than that of comparable conductors which contain cores of superconductive alloys such as niobium-titanium. One therefore attempts to make the layers of the superconductive compounds on the surface of the core and, also, the cores themselves as thin as possible. Since heavy cross section reductions of the intermediate products are required for this purpose, the conductor strands containing the cores themselves also have a relatively small cross section as a rule. This has the advantage that the cores within a conductor strand are located relatively close to the neutral axis when the conductor is bent, for instance, in winding a coil, so that the mechanical tensile and compression stresses occurring in the compound layers can be kept within limits even for relatively small bending radii. However, if large currents are to be obtained, a number of thin individual strands must be combined in a conductor of larger cross section in which the superconducting layers of the individual conductor strands are again farther removed from the neutral axis.

In superconductors with intermetallic compounds, the electrical stabilization of the superconductors is a further problem. Stabilization requires a metal of high thermal and electric conductivity which is electrically normally conducting at the operating temperature of the superconductor. In contrast to superconductors, in which, for instance, thin filamentary cores of niobium-titanium are embedded in a copper matrix, the alloy material surrounding the cores with an intermetallic compound can be utilized for stabilization only with difficulty. For, since, even after the superconductive compound is formed, the alloy material still contains residues of the lower melting point element or several such elements of the compound, it has a substantially higher electrical resistance than, for instance, pure copper, at the operating temperature of the superconductor, which is below the critical temperature of the respective superconductor material, i.e., as a rule between about 1 and 20 K. To achieve better stabilization, strands of stabilizing metal, for instance, copper, are provided in the superconducting composite conductors known from Auslegeschrift No. 23 45 779 and Offenlegungsschrift No. 26 54 924, in addition to the strands with the superconductive compound. So as to also achieve maximum flexibility of the conductor after the heat treatment for forming the superconductive compound, however, separator means which prevent adjacent strands from sticking together, especially due to diffusion during the heat treatment, are arranged in these known conductors between the individual strands. As a consequence, no intimate electrical and thermal contact is formed between the strands with the superconductive compound and the strands of stabilizing metal. This, in turn, can have a very unfavorable effect on the stabilizing action of the strands of stabilizing metal. In the known composite conductors, therefore, in order to provide a further improvement of the stabilization, the possibility of arranging additional zones of stabilizing metal, within the individual strands with the superconductive compound, which zones extend along the strand and are enclosed by a diffusion-inhibiting layer, for instance, of niobium, vanadium or tantalum, is disclosed. This diffusion inhibiting layer acts to prevent diffusion of the lower melting point element of the compound into the stabilizing metal during the heat treatment, and, thereby, prevents an increase of the electric resistance of the stabilizing metal (see, for instance, German Auslegeschrift No. 23 45 779, col. 8, line 55, to col. 10, line 40, and German Offenlegungsschrift No. 26 54 924, page 28, para. 3, to page 29, last line).

Such stabilizing zones within the conductor strands, however, have the disadvantage, for one, that they increase the cross section of the strand, whereby the distance of the cores from the neutral axis of the conductor strand is increased, at least if the stabilizing zone is arranged in the center. This in turn also increases the distance of the layers of the superconducting intermetallic compound from the neutral axis. Secondly, the fabrication of such conductor strands is accompanied by great problems due to the different material properties of the cores, alloy jacket, diffusion inhibitor and stabilizing metal. In particular, cracks can readily occur in the diffusion inhibiting layer, through which cracks the lower melting point element of the compound can penetrate into the stabilizing metal. In such a case, the entire conductor strand, including the superconductor material, then becomes unusable.

SUMMARY OF THE INVENTION

It is an object of the present invention to improve the electrical stabilization of the composite conductors mentioned at the outset, while zones of stabilizing metal within the individual strands with the superconductive compound are to be avoided to the extent possible.

According to the present invention, this problem is solved by the provision that the strand of the stabilizing metal is joined to the adjacent strands containing the superconductive compound by diffusion of at least one lower melting point element of the compound and contains at least one zone, which zone extends along the strand and is enclosed by a diffusion inhibiting layer.

Contrary to the known composite conductors, in which a bond between the individual strands due to diffusion is expressly to be avoided, such a bond is intentionally brought about in the conductor according to the present invention, which leads to an intimate thermal and electrical contact between the strands with the superconductive compound and the strands with the stabilizing metal. For, it has been found, contrary to all expectations, that the flexibility of the composite conductor is fully adequate for the usual applications of the composite conductor, for instance, for winding superconductor magnet coils, in spite of the diffusion bond between the strands. Otherwise, it is also possible to establish the diffusion bond between the conductor strands only after the conductor has been given its final form, for instance, after the conductor has been wound into a coil. So as not the disturb the formation of a superconductive compound, for instance, by the addition of a foreign element, a lower melting point element of the compound or several such elements are used for establishing the diffusion bond between the strands. The lower melting point element can then diffuse only into a surface layer of the strand of stabilizing metal, while the inner region thereof is protected against diffusion by the diffusion inhibiting layer and consequently retains its high thermal and electric conductivity. Normally, only one such region will be provided in a strand of stabilizing metal; in special cases, however, the strands can also contain several such regions. Since the strands with the superconductive compound and the strands of stabilizing metal can be produced in separate operations, up until their combination in one conductor, the technical difficulties in the manufacture of the conductor are considerably reduced.

It is particularly advantageous for a good stabilizing effect if every strand with the superconductive compound is bonded to at least one strand of stabilizing metal.

Especially for larger conductor cross sections or for building up the composite conductor from numerous conductor strands, it is further advantageous to construct the composite conductor as a flat cable. For, in such a flat cable, the individual cores are substantially closer to the neutral axis of the conductor in one bending direction than with a circular cable of corresponding cross section.

The composite conductor can furthermore advantageously be designed in such a manner that the strands with the superconductive compound and the strands of stabilizing metal have the same cross section. Then the strands of both kinds can be mixed within the conductor without difficulty.

Preferably, the strands with the superconductive compound will be the type which have a multiplicity of filamentary cores embedded in a matrix of the alloy, with a layer of the superconductive compound at least on the surfaces thereof.

In the composite conductor according to the present invention, the compounds $Nb_3Sn$ and $V_3Ga$ are particularly advantageous as the superconducting compound. The higher melting point element of the superconductive compound is one of the metals niobium and vanadium and the lower melting point element is one of the elements tin and gallium.

Suitable carrier metals for the alloy which contains the cores include, in principle, all metals which form a ductile alloy with the lower melting point elements of the compound and do not adversely affect the formation of the compound during the heat treatment, for instance, copper, silver, nickel or alloys of these metals. Also, for the stabilizing metal, all metals with high thermal and electric conductivity which are normally conducting at the operating temperature of the superconductor and do not disturb the formation of the superconductive compound, are suited in principle. Copper is particularly advantageous as the carrier metal of alloy as well as for the stabilizing metal.

For the diffusion inhibiting layers inside the strands of stabilizing metal the metals tantalum, niobium or vanadium are suited especially. These metals, in particular, prevent the diffusion of tin and gallium. If there is danger that, during a heat treatment, sufficient tin or gallium will diffuse into the stabilizing conductors so that, at the surface of the diffusion inhibiting layers of niobium or vanadium itself, superconductive intermetallic compounds are formed again, additional diffusion inhibiting layers can be provided, as is known from German Offenlegungsschrift No. 25 43 613, especially page 7, para. 2, to page 10, para. 1, in order to prevent the formation of a closed layer of the superconductive compound, enclosing the remaining region of stabilizing metal on all sides. For, such a superconducting layer, which encloses the stabilizing metal from all sides, can affect the stabilizing action adversely because of its shielding effect. For mechanically reinforcing the composite conductor, especially for taking up tensile forces, one or more strands of reinforcement material, for instance, alloy steel, can further be provided within the conductor. As a rule, these strands should have higher tensile strength than the other strands of the composite conductor.

The composite conductor according to the present invention can advantageously be manufactured in such a manner that several strands which contain at least one core of at least one higher melting point element of the superconductive compound embedded in an alloy of a carrier metal and at least one lower melting point element of the compound, and at least one strand of stabilizing metal, which contains at least one region which extends along the strand and is enclosed by a diffusion inhibiting layer, are joined together in a conductor, wherein at least one kind of strand is coated with a layer of at least one lower melting point element of the compound, and that the conductor is heat treated for joining the strands together by diffusion and for producing the superconductive intermetallic compound. The layer of at least one lower melting point element of the compound which is to be applied on the strands with the elements of the superconductive compound or on the strands of stabilizing metal or on both, ensures a good diffusion bond between the conductors and prevents the lower melting point elements of the compound of the strands with the cores of the higher melting point elements of the compound, where they are needed primarily for forming the superconductive compound, from diffusing into the strands of the stabilizing metal.

One can advantgeously further perform a first heat treatment for joining the strands by diffusion at a temperature below the formation temperature of the superconductive compound and a second heat treatment above this temperature for producing the superconductive compound. The first heat treatment can be combined particularly with a hot deformation of the strands for sizing and shaping the conductor. Two heat treatments are advantageous particularly in cases where the second heat treatment for producing the superconductive compound is performed only after the conductor is given its final form, for instance, when the conductor is already wound into a coil. Through the first heat treatment, the conductor strands then already adhere to each other firmly and cannot bend away from each other when the coil is wound.

DETAILED DESCRIPTION OF THE INVENTION

Figure 1:
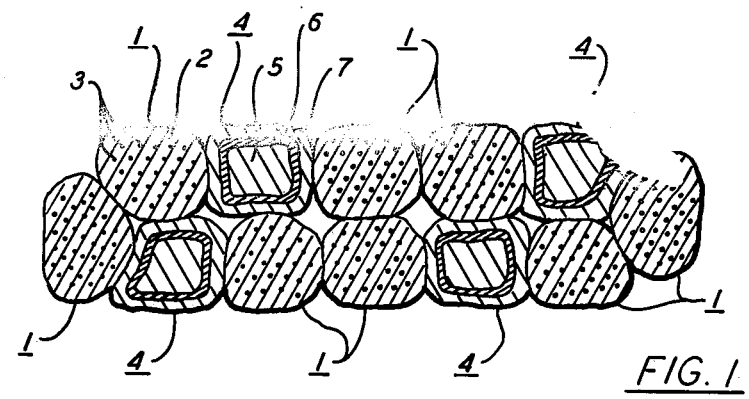
FIGS. 1 to 3 are diagrammatic cross sections of different embodiments of a composite conductor according to the present invention.

In the conductor shown in FIG. 1, eight conductor strands 1 which contain, in an alloy matrix 2 consisting of a carrier metal and the lower melting point element of a superconductive intermetallic compound, a multiplicity of filamentary cores 3 of the higher melting point element of the compound, are stranded with four strands 4 of stabilizing metal to form a flat cable in such a manner that each strand 1 is in contact with a strand 4. Each strand 4 contains an inner region 5 which extends along the strand and is enclosed by a diffusion inhibiting layer 6. The latter is again surrounded by an outer layer 7 of stabilizing metal.

As is well known, the conductor strands 1 can be made, for instance, by bundling niobium rods surrounded by a copper-tin jacket and first hot-deforming the arrangement so obtained for producing an intimate metallurgical bond between the individual parts and subsequently drawing it into a thin wire in a series of cold working steps which may be interrupted by intermediate anneals for recovery of the structure of the alloy matrix. Toward the end of this deformation, this wire can further be twisted about its axis so that filamentary cores 3 describe helical paths about the axis of the wire. Such twisted strands have the advantage that the filamentary cores 3 are completely transposed within the stranded composite conductor, i.e., occupy all possible positions sequentially along the composite conductor.

The strands 4 can be similarly made, starting out, for instance, with an intermediate product which consists of a copper rod which is surrounded by a tantalum jacket and is inserted into a copper tube.

For the further fabrication of the conductor according to FIG. 1, the strands 4 can be tinned, for instance, and subsequently stranded with the strands 1, which are advantageously provided with flux, to form a flat cable. For sizing and shaping, the flat cable can be hot-rolled, for instance, at a temperature below 650° C., at which $Nb_3Sn$ is not yet formed. It is advisable to start at about 200° C., so that the tin does not run off, and then to continue heating. In this heat treatment, tin diffuses from the surface of the strands 4 into the outer zone 7 of the strands 4 located outside the diffusion inhibiting layer 6 as well as into the alloy matrix 2 of the strands 1 and establishes an intimate diffusion bond between the strands 1 and 4. In a second heat treatment at about 700° C., the $Nb_3Sn$ layers are then formed at the surface of the niobium cores 3. In addition, the diffusion bond between the strands 1 and 4 is further strengthened thereby.

In a conductor according to FIG. 1, in which the diameter of the individual strands was 0.4 mm, the strands 1 contained 1615 niobium filaments 3 with a diameter of 4.7 $\mu$m each in a copper-tin matrix. The strands 4 had a copper core 5 with a diameter of about 240 $\mu$m, a diffusion inhibiting tantalum layer 6 with a thickness of about 30 $\mu$m and an outer copper jacket 7 with a thickness of about 50 $\mu$m. With such a composite conductor, the overall cross section of which was about $0.74 \times 2.7$ mm$^2$, a critical current of about 1200 A was obtained at a temperature of 4.2 K and without an external field, and a critical current of about 590 A with an external magnetic induction of about 10 Tesla. These values were obtained with short wire samples as well as with a conductor wound into a coil, in which the second heat treatment for forming the $Nb_3Sn$ layers was performed after the coil was wound.

Figure 2:
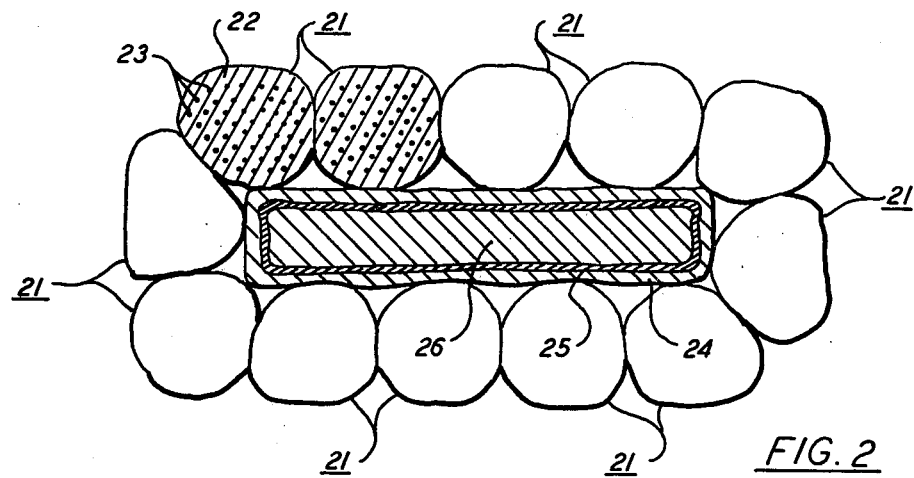

In the conductor shown in FIG. 2, twelve strands 21 containing a multiplicity of cores 23 in an alloy matrix 22, are stranded about a ribbon-shaped strand 24 of stabilizing metal, which contains a zone 26 enclosed by a diffusion inhibiting layer 25. The strand 24 of stabilizing metal is touched by each of the strands 21. The conductor can be fabricated by using the methods described in detail in connection with FIG. 1. With a conductor according to FIG. 2, the strands 21 of which corresponded to the strands 1 of the conductor of FIG. 1, and the strand 24 of which was made of copper and had a cross section of about $0.3 \times 1.5$ mm$^2$ and again contained a tantalum layer as a diffusion inhibitor, a critical current of 930 A was obtained at 4.2 K with an external induction of 10 Tesla. For small bending radii, however, the conductor design according to FIG. 2 is less advantageous than that of FIG. 1, since the filaments 23 are further removed from the neutral axis of the conductor than are the filaments 3.

Figure 3:
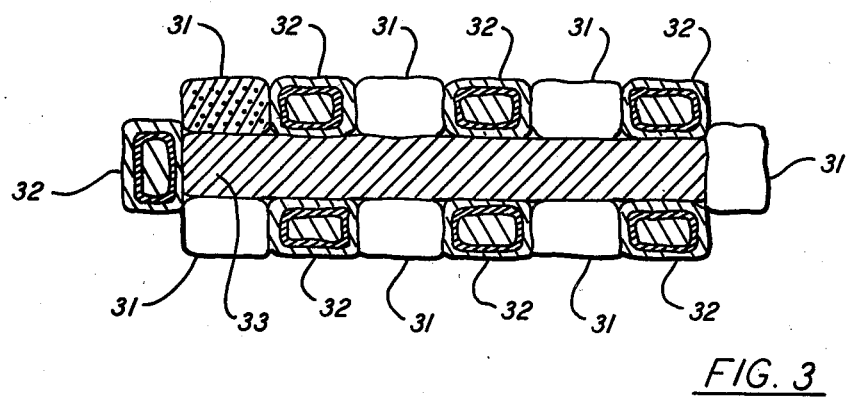

FIG. 3 shows diagrammatically a further embodiment of a conductor according to the present invention, in which strands 31 with a superconductive intermetallic compound and strands 32 of stabilizing metal are alternatingly stranded about a ribbon shaped strand 33 of reinforcement material, for instance, alloy steel. The strands 31 and 32 can optionally be connected to this strand 33 of reinforcement material by a diffusion joint or by soldering. Strands of reinforcement material which have the same diameter as the other strands of the conductor can also be used, of course, and can be stranded, for instance, with the other strands in the manner shown in FIG. 1.

The conductor according to the present invention and its manufacture can be modified further in many ways from the examples. For instance, one can also provide the finished but not yet heat treated conductor with a layer of one or more of the lower melting point elements of the compound, instead of the individual strands. Instead of providing the strands of stabilizing metal with a layer of one or more of the lower melting point elements, one can also make the outer jacket surrounding the diffusion inhibiting layer of an alloy of this element or these elements with the stabilizing metal. In such a strand, a copper core would then be surrounded, for instance, by a tantalum layer and the latter, in turn, by a copper-tin or copper-gallium jacket.

Instead of stranding the strands, they can also be braided into a litz wire. The cores embedded in the alloy matrix of the superconductor strands, furthermore, need not consist of a single metal but can optionally also contain additions; for instance, titanium or zirconium can also be admixed to the niobium or the vanadium in amounts of up to about 30% by weight. In the alloy matrix, the elements tin and gallium may also be present side by side, for instance.

The strands with the superconductive compound can also contain additional regions of stabilizing material surrounded by diffusion inhibiting layers. In general, however, this will not be necessary because of the good stabilizing effect of the strands of stabilizing metal joined to these strands. Furthermore, it is also not absolutely necessary to use an alloy of a carrier metal and at least one lower melting point element of the compound, in which at least one core of at least one higher melting point element of the compound is embedded, as starting bodies for the strands with the superconductive compound. One can rather start also with a strand of the carrier metal alone, which contains one or several cores, and diffuse the lower melting point elements into the carrier metal only during the heat treatment of the composite conductor built up from the strands.

This can be achieved, for instance, by tinning a strand with niobium cores in a copper matrix before or after the stranding and then annealing it. It is furthermore possible to supply the tin during the heat treatment from the vapor or gas phase.

What is claimed is:

1. A superconducting composite conductor comprising:
   (a) several strands with a superconductive intermetallic compound of at least two elements each containing at least one core of at least one higher melting point element of the compound having, at least on its surface, a layer of the compound, embedded in an alloy of at least one lower melting point element of the compound and a carrier metal; and
   (b) at least one strand of a stabilizing metal of high thermal and electric conductivity which is normally conducting at the operating temperature of the superconducting composite conductor containing at least one region which extends along the strand and is enclosed by a layer inhibiting diffusion, the strand of stabilizing metal joined to the strands with the superconductive intermetallic compound by diffusion of at least one lower melting point element of the compound.

2. A composite conductor according to claim 1, wherein each strand with the superconductive compound is joined to at least one strand of stabilizing metal.

3. A composite conductor according to claim 1, wherein said strands are arranged to form a flat cable.

4. A composite conductor according to claim 1, wherein the strands with the superconductive compound and the strands of stabilizing metal have the same cross section.

5. A composite conductor according to claim 1, wherein the strands with the superconductive compound comprise a multiplicity of filamentary cores with a layer of the compound at least on the surface thereof embedded in a matrix of the alloy.

6. A composite conductor according to claim 1, wherein the higher melting point element of the superconductive compound is selected from the group consisting of the metals niobium and vanadium and the lower melting point element is selected from the group consisting of the elements tin and gallium.

7. A composite conductor according to claim 1, wherein the carrier metal of the alloy and the stabilizing metal are copper.

8. A composite conductor according to claim 1, wherein the diffusion inhibiting layer is selected from the group consisting of the metals tantalum, niobium and vanadium.

9. A composite conductor according to claim 1, and further including at least one additional strand of reinforcement material in said conductor.

10. A method of manufacturing a superconducting composite conductor comprising several strands with a superconductive intermetallic compound of at least two elements each containing at least one core of at least one higher melting point element of the compound having, at least on its surface, a layer of the compound, embedded in an alloy of at least one lower melting point element of the compound and a carrier metal; and at least one strand of a stabilizing metal of high thermal and electric conductivity which is normally conducting at the operating temperature of the superconducting composite conductor containing at least one region which extends along the strand and is enclosed by a layer inhibiting diffusion comprising:
   (a) placing several strands which contain at least one core of at least one higher melting point element of the superconductive compound, embedded in an alloy of a carrier metal and at least one lower melting point element of the compound, in abutting relationship to at least one strand which contains at least one region which extends along the strand and is enclosed by a diffusion inhibiting layer to form a composite conductor;
   (b) coating at least one kind of strand with a layer of at least one lower melting point element of the compound prior said step of placing; and
   (c) heat treating the composite conductor so formed to join the strands by diffusion and to produce the superconductive intermetallic compound.

11. The method according to claim 10, comprising:
   (a) performing a first heat treatment at a temperature below the formation temperature of the superconductive compound for joining the strands by diffusion; and (b) performing a second heat treatment at a temperature above this temperature for producing the superconductive compound.

12. The method according to claim 11, wherein said first heat treatment is combined with hot deformation for sizing and shaping the conductor.

13. The method according to claim 11, wherein said second heat treatment is performed only after the conductor has been given its final form.

* * * * *